United States Patent [19]

Hattori et al.

[11] Patent Number: 5,473,111

[45] Date of Patent: Dec. 5, 1995

[54] SHIELDED ENCLOSURE FOR HOUSING ELECTRONIC COMPONENTS AND MANUFACTURING METHOD THEREOF

[75] Inventors: Yoshiyuki Hattori; Mutuo Hatayoshi, both of Aichi, Japan

[73] Assignee: Mitsubishi Denki Kabushiki Kaisha, Tokyo, Japan

[21] Appl. No.: 120,468

[22] Filed: Sep. 14, 1993

[30] Foreign Application Priority Data

Oct. 7, 1992 [JP] Japan ..................... 4-268610

[51] Int. Cl.⁶ ........................................ H05K 9/00
[52] U.S. Cl. ................ 174/35 R; 29/527.4; 361/818
[58] Field of Search ............... 174/35 R, 35 GC, 174/35 MS; 361/816, 818; 250/505.1, 515.1; 455/300, 301; 29/527.4

[56] References Cited

U.S. PATENT DOCUMENTS

| 4,381,421 | 4/1983 | Cocets et al. ................ 174/35 R |
| 4,608,453 | 8/1986 | Freeman ...................... 174/35 MS |
| 4,777,565 | 10/1988 | McIntosh ..................... 174/35 R |
| 4,941,207 | 7/1990 | Maeda et al. ................. 174/35 MS |
| 5,008,487 | 4/1991 | Shimmyo ..................... 174/35 R |
| 5,137,766 | 8/1992 | Mazanek et al. .............. 428/68 |
| 5,150,282 | 9/1992 | Tomura et al. ................ 174/35 MS |
| 5,204,497 | 4/1993 | Herrilk ....................... 174/35 R |
| 5,239,125 | 8/1993 | Savage et al. ................. 174/35 MS |

FOREIGN PATENT DOCUMENTS

| 3608938 | 9/1987 | Germany . |
| 3838901 | 5/1990 | Germany . |
| 58-115894 | 7/1983 | Japan . |
| 59-18496 | 2/1984 | Japan . |
| 61-22915 | 1/1986 | Japan . |
| 63-201391 | 12/1988 | Japan . |

Primary Examiner—Morris H. Nimmo
Assistant Examiner—Christopher Horgan
Attorney, Agent, or Firm—Sughrue, Mion, Zinn, Macpeak & Seas

[57] ABSTRACT

An EMI protected enclosure and method of manufacture thereof. The enclosure is plastic and has an electromagnetic interference shield member disposed therein to protect the electronic parts or electronic equipment from electromagnetic interference. The electromagnetic interference shield member is exposed at the edges of the enclosure and can be formed into an electrical connector or otherwise connected to provide a ground for the enclosure. In the manufacturing method, the securing and shaping of the electromagnetic interference shield member by the closure of the molding dies eliminates the need for any pre-forming of the electromagnetic interference shield member.

12 Claims, 4 Drawing Sheets ained on the lower die 212 and supplied with fused resin 217 from

SHIELDED ENCLOSURE FOR HOUSING ELECTRONIC COMPONENTS AND MANUFACTURING METHOD THEREOF

BACKGROUND OF THE INVENTION

1. Field of the Invention

The present invention relates to an enclosure, consisting of a box or a cover for housing electronic parts or equipment to protect the electronic parts or equipment from electromagnetic interference (EMI), and to a method of manufacturing the enclosure.

2. Description of the Background Art

Electronic parts and equipment known in the art often are housed in cabinets (enclosures) made of metal which act as electromagnetic interference (EMI) shields. With the progress of technology, parts and apparatuses became more and more compact. To satisfy the demand for appropriate enclosures, plastic molded enclosures that could be efficiently produced at low costs were developed. However, such enclosures pose EMI problems.

A variety of conventional techniques are employed as the methods of EMI-shielding for plastic molded enclosures. Among these are the following: (1) a method wherein paint using a conductive material, e.g., silver or copper, as a filler, is applied to an enclosure after the molding of the enclosure, (2) a flame spraying method wherein the conductive material, e.g., silver or copper, is fused and sprayed to an enclosure by high-pressure air, (3) a vacuum metallizing method wherein metal of low boiling point (such as aluminum) is evaporated in a vacuum to form a thin film on enclosure surfaces, (4) a method wherein electroless plating of nickel, etc., is provided to an enclosure molded by high-adhesive resin, e.g., ABS resin, (5) a method wherein a molding material filled with a conductive filler, such as carbon or aluminum flakes, is used to mold an enclosure, and (6) a method wherein a composite material made by laminating a polyvinyl chloride (PVC) or polyester film to an aluminum, copper or other film is applied to an enclosure.

Also, various methods of integrally molding a metal shield material with resin have been developed.

FIG. 6(a) shows a housing for digital electronic equipment disclosed in Japanese Laid-Open Patent Publication SHO 61-22915, wherein the numeral 217' indicates resin and 215' represents a wire netting. FIG. 6(b) is a diagrammatic sectional view of dies and illustrates a molding state, wherein 211 denotes an upper die, 212 designates a lower die, 213 indicates a resin gate provided in the lower die 212, and 215 denotes an electromagnetic interference reflecting and interrupting wire netting. The wire netting 215 is placed on the lower die 212 and supplied with fused resin 217 from the gate 213, the upper die 211 is subsequently closed, and the wire netting 215 is then pressed. After cooling, the molding process is complete and the enclosure is removed. In this case, the netting must be preformed in a box shape so that corners can be properly shaped in the enclosure. The preforming of the netting into other shapes is required, depending on the final shape of the enclosure.

FIG. 7(a) shows an electronic apparatus disclosed in Japanese Laid-Open Utility Model Publication SHO 63-201391, wherein 71 indicates a metal chassis containing electronic parts, electronic circuits, etc., and 73 denotes a cover. As shown in FIG. 7(b), the metal chassis 71 houses electronic circuit cards 72. As shown in FIGS. 7(c) to 7(e), the cover 73 is made of a wire netting 74 and plastics which are formed integrally, the wire netting 74 is exposed in the periphery of the cover 73 so that when the cover 73 is fitted to the chassis 71, the wire netting 74 and chassis 71 are electrically conductive. It should be noted that a cover manufacturing method is not described in this publication.

In addition to the above, a method of inserting a preformed electromagnetic interference shield material at the time of molding is disclosed in Japanese Laid-Open Utility Model Publication SHO 59-18496 and Japanese Laid-Open Patent Publication SHO 58-115894.

The conventional methods of molding an enclosure and subsequently forming a conductive film on an enclosure surface by any of conductive paint application, conductive material flame-spraying, vacuum metallizing and resin plating are high-priced and have the problem of film peeling. Also, the method of using a molding material filled with a conductive filler to mold an enclosure does not provide a uniform dispersion of the conductive filler inside a molded product and provides a poor shielding effect.

Also, the method disclosed in Japanese Laid-Open Patent Publication SHO 61-22915 required the wire netting to be preformed, resulting in a larger number of processes and higher cost. Further, the method disclosed in Japanese Laid-Open Utility Model Publication SHO 63-201391 involves high costs because one part of the enclosure was made of metal.

SUMMARY OF THE INVENTION

It is, accordingly, an object of the present invention to overcome the disadvantages in the conventional art by providing an enclosure and an enclosure manufacturing method which allow a shield material to be molded integrally with resin without pre-forming, whereby the enclosure and its manufacturing method are low in price, high in workability, and have an electromagnetic interference shielding function.

In accomplishing these and other objects of the invention, an electromagnetic interference shield member is disposed inside the molded resin in order to protect the electronic parts or electronic equipment from electromagnetic interference and the electromagnetic interference shield member is exposed at the edges of the enclosure and provides a contact or other connection to ground, even where the wall of the enclosure is thin.

The method of shaping and securing the electromagnetic interference shield member during closure of the die is a further feature of the invention in that it eliminates the need for any pre-forming of the electromagnetic interference shield member.

The provision of an excess area of the electromagnetic interference shield member so that a portion of the member extends from the outer peripheries of the cavity and core of the dies in a further feature of the invention eliminates the need for any special machining on the dies.

The air vent feature of the present invention releases high-temperature air from inside the enclosure to the outside while maintaining EMI protection.

DESCRIPTION OF THE PREFERRED EMBODIMENTS

Figure 1:
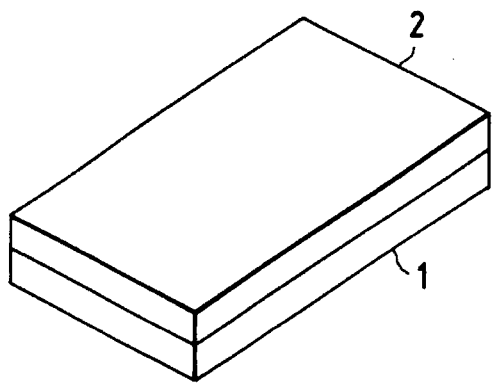
FIG. 1 is a perspective view of an enclosure consisting of a box and a cover for housing electronic parts or equipment as a preferred embodiment of the present invention.

FIG. 1 is a perspective view of an enclosure consisting of a box and a cover for housing electronic parts or equipment (not shown) as an embodiment of the present invention. In FIG. 1, the numeral 1 denotes a box of the enclosure which may also be a box using the present invention or a box made of metal such as diecast aluminum. Numeral 2 designates a cover of the enclosure using the present invention. The shapes of the box and cover are shown as rectangular, with a planar plate area ending substantially at an edge with side portions extending perpendicular thereto;

but, the box and cover may have other geometric shapes with planar plates area such as circles, triangles and the like.

Figure 2:
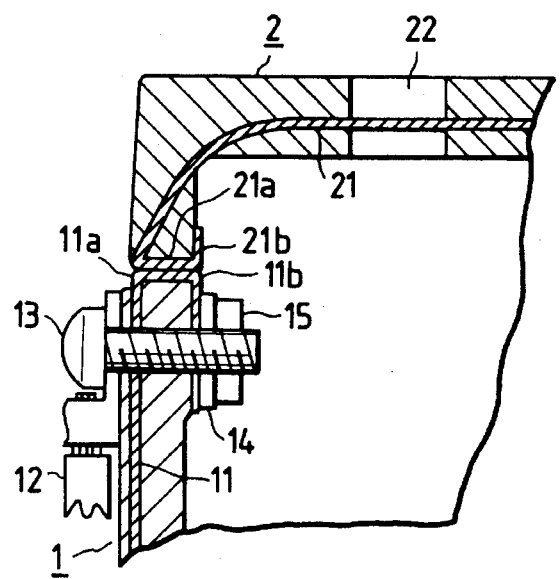
FIG. 2 is a sectional view illustrating some portion of FIG. 1.

FIG. 2 is a sectional view showing part of FIG. 1, wherein an electromagnetic interference shield member 21, which has been manufactured out of an extremely flexible material, i.e., a wire netting made of copper wires or the like 30 to 60 μm in diameter or a metal foil, such as a copper foil, with a plurality of small holes, is disposed in the cover 2. At the edge of the cover 2 is an exposed area 21a and a folded area 21b of the electromagnetic interference shield member 21. Also, an air vent 22 where only the electromagnetic interference shield member 21 remains is provided in part of the cover 2 at the time of molding. When the present invention is also used for the box, an electromagnetic interference shield member 11 is similarly disposed in the box 1, and as in the cover 2, an exposed area 11a and a folded area 11b are provided on the edge of the box 1. The folded area 11b is connected with a ground cable 12 by a bolt 13, a washer 14 and a nut 15. When the cover 2 is fitted to the box 1 in any of several conventional manners that are not illustrated, the exposed area 11a of the electromagnetic interference shield member 11 in the box 1 and the exposed area 21a of the cover 2 are brought into electrical contact with each other.

When the box is made of metal such as aluminum diecast, fitting the cover of the present invention to the metal box causes the exposed area 21a of the cover 2 to make electrical contact with the metal box.

Figure 3:
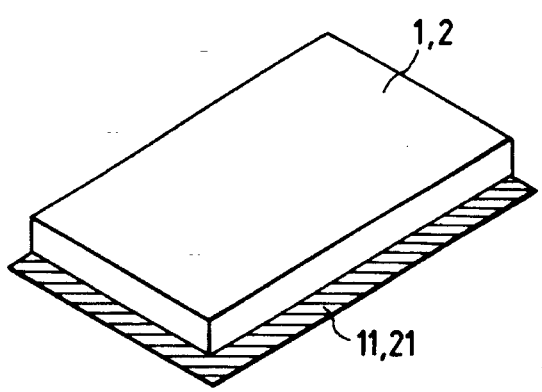
FIG. 3 is a perspective view illustrating the molded enclosure of the present invention.
Figure 4:
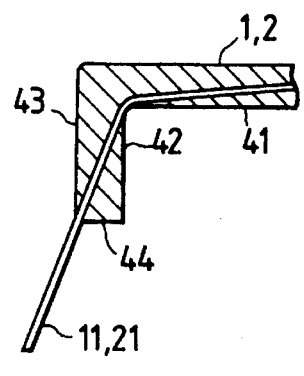
FIG. 4 is a sectional view illustrating some portion of FIG. 3.

FIG. 3 is a perspective view of the box or cover immediately after molding. FIG. 4 is a sectional view showing a portion of FIG. 3. The electromagnetic interference shield member 11 or 21 is disposed so as to follow the major planar surface of the box or cover and to bend so as to make substantial contact with the intersecting point of an inner bottom or inner top plate 41 and an inner side wall 42 of the box 1 or cover 2. Further, the shield member 11 or 21 will angle from the position adjacent the intersecting inner surfaces toward the external surface of side wall 43. The shield member will exit the box or cover at an edge 44. The excess portion of the shield member may be shaped or formed around edge 44 to provide the exposed conductive surface 11a or 21a seen in FIG. 2.

A method of manufacturing the enclosure shown in FIG. 3 will now be described. Generally, the box or cover of the enclosure is fabricated by resin molding using dies which consist of an upper die (typically a cavity) and a lower die (typically a core). To manufacture the box or cover, a molding material is first heated, softened and fused. This molten material is subsequently injected into a space made by the combination of the upper and lower dies. After being pressed and set, the dies are opened, and finally the molded product is removed from the dies.

As would be understood by one skilled in the art, the upper die and the lower die described as the cavity and the core may also be defined as the core and the cavity, respectively.

Figure 5A:
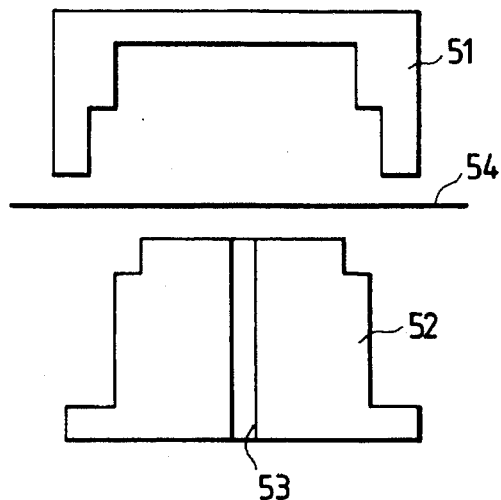
FIGS. 5(a)–(d) are a diagrammatic sectional view of dies employed to mold the enclosure of the present invention.

An enclosure molding method as an embodiment of the present invention will now be described in accordance with FIGS. 5(a)–5(d), which is a diagrammatic sectional view of dies used to mold the enclosure of the present invention. Referring to FIG. 5(a), when an upper die 51 and a lower die 52 are open, an electromagnetic interference shield member 54 in a pre-cut state is put on the core of the lower die 52 in a preset position by a robot or the like (not shown). The electromagnetic interference shield member 54 is a pre-cut, planar plate-shaped wire netting made of copper wires or the like of 30 to 60 μm in diameter or a copper foil having a plurality of small holes. The material used should be sufficiently flexible so as to be shapeable by the dies without significant force. FIGS. 5(a)–5(d) represent that the upper die 51 is at the top, the lower die 52 is at bottom, and the upper die 51 moves vertically. If the upper die 51 and lower die 52 are disposed in a horizontal direction and the upper die 51 moves in the horizontal direction, the electromagnetic interference shield member 54 may be suspended by a robot or the like (not shown) and the robot hand moved with the movement of the upper die 51. The upper die 51 is then moved toward the lower die 52 under the command of a control apparatus (which is not shown) in a movement referred to as die closing. Die closing speed is approximately .50% lower than ordinary injection molding speed.

Figure 5B:
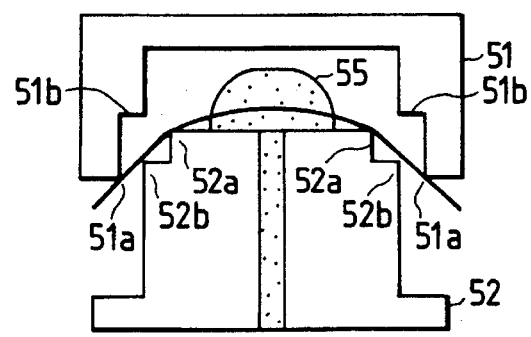

Referring to FIG. 5(b), a gate 53 provided in the lower die 52 is opened and a measured quantity of softened, fused molding material 55 begins to be injected therefrom. As also seen in the Figure, as the upper die 51 goes down, the electromagnetic interference shield member 54 is bent due to the contour of the dies, as die corners 51a and 52a contact the member. As the member 54 surface is further pressed against the opposed corners 52a of the lower die 52 by the opposed corners 51a of the upper die 51, the member is lightly held. The molding material injected from the gate 53 also penetrates toward the upper die 51 through the meshed holes provided in the shield member 54. The injection speed is reduced so that the molding material does not splash or move the member 54. The fusing temperature of the molding material is set as appropriate according to the type of the molding material.

Figure 5C:
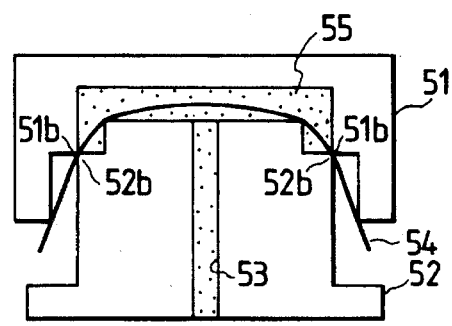
Figure 5D:
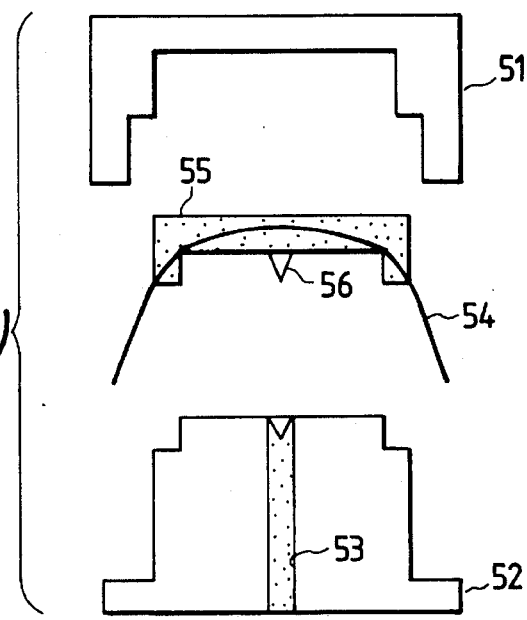
Figure 6A:
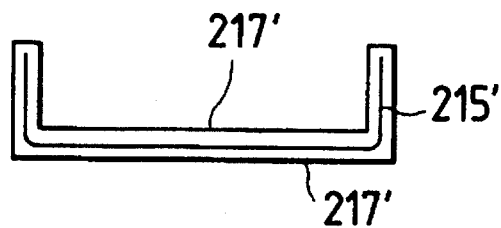
FIGS. 6(a)–(b) are a diagrammatic sectional view illustrating an enclosure and dies known in the art.
Figure 6B:
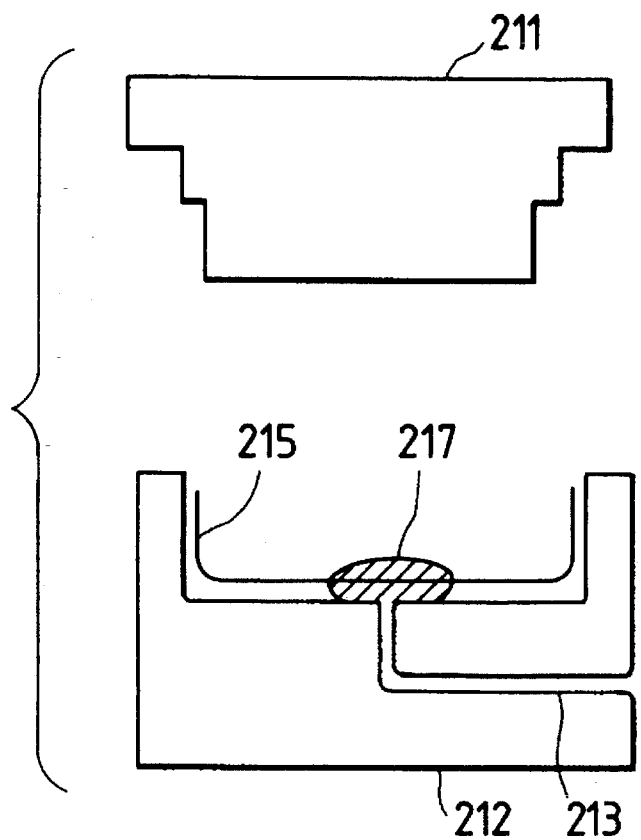
Figure 7A:
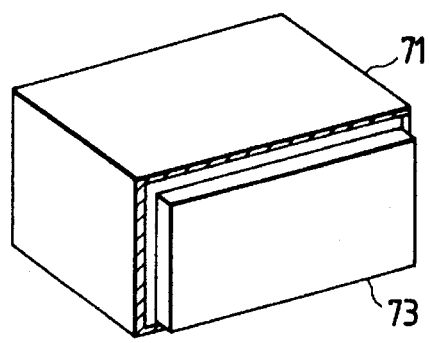
FIGS. 7(a)–(e) are a perspective view and a sectional view illustrating another conventional art enclosure for an electronic apparatus.
Figure 7B:
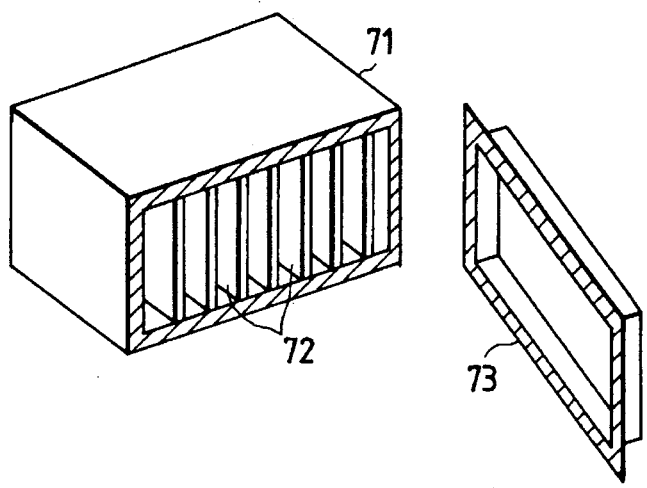
Figure 7C:
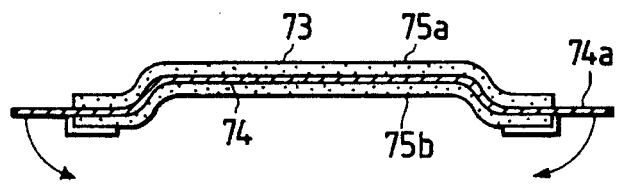
Figure 7D:
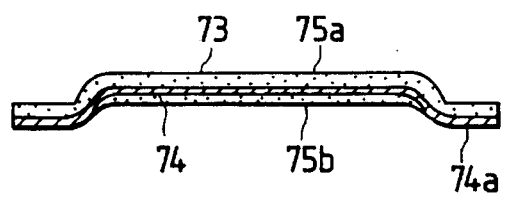
Figure 7E:
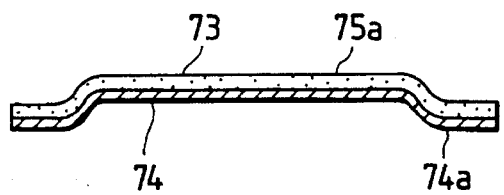

The movement of the molding material 55 through the meshes of the shield member and the contour of the dies will force the shield member to have a slightly spherical surface shape. This causes the electromagnetic interference shield member 54 to be adjacent to the gate 53 to rise from the core of the lower die 52. As die closing progresses, as seen in FIG. 5(c), the electromagnetic interference shield member 54 tends to be offset toward the lower die 52 by the pressure of the molding material 55. As a result, the electromagnetic interference shield member 54 is not exposed to the outside of the enclosure and does not mar the external surface appearance of the enclosure. At the final stroke of die closure, the electromagnetic interference shield member 54 comes out of a gap where the outer periphery of the cavity makes contact with the outer periphery of the core to the outside of an enclosure-shaped space formed by the cavity and the core.

After an appropriate setting time has elapsed following the die closing, the upper die 51 is opened and the molded product is removed from the lower die 52, as seen in FIG. 5(*d*). The completed enclosure will have a remainder portion 56 that can be removed or retained, as dictated by appearance requirements. The mesh extending from the molded product can be shaped into an electrical contact, as in FIG. 2, or otherwise connected electrically to a ground to provide a desired EMI protection.

Whereas the die closing speed was described as a single speed, normal speed may be used for a duration until partial completion of the die closing stroke and the subsequent speed may be a reduced speed, e.g., approximately 50% of the normal speed.

Also, the injection of the molding material described to start midway during the period of die closing may also be carried out after the upper die has been closed up to the final stroke if the walls of the enclosure are relatively thick.

As the molding material, any of a number of injection molding materials may be employed, e.g., such general-purpose thermoplastic molding resins as polypropylene (P. P.), ABS, polycarbonate (PC), polyphenylene oxide (PPO) and polyamide (PA), and such engineering plastics as PA/PPO alloy and PC/PBT (polybutylene terephthalate).

The molding material may also be thermosetting resin such as phenol resin, epoxy resin or polyurethane resin. With any of these materials, the present invention contemplates injection into the mold in a fluid or powder form followed by chemical or thermal "curing" into a hardened form.

As described above, it will be apparent that the invention achieves a low-priced enclosure for housing electronic parts or equipment. In the manufacture of this housing, the molding processes is simplified because the electromagnetic interference shield member 54 may be used in a pre-cut, planar plate state without being preformed, and a resin molding process can be started immediately. Also, the enclosure can improve a heat dissipation effect by providing an air vent which still has the protection provided by the electromagnetic interference shield member that forms part of the enclosure. Further, the invention achieves an enclosure which does not require any special dies to expose the electromagnetic interference shield member to the exterior of the enclosure, whereby a sufficient electrical contact surface is provided if the walls of the enclosure are thin.

The entire disclosure of each and every foreign patent application from which the benefit of foreign priority has been claimed in the present application is incorporated herein by reference, as if fully set forth.

Although this invention has been described in at least one preferred embodiment with a certain degree of particularity, it is to be understood that the present disclosure of the preferred embodiment has been made only by way of example and that numerous changes in the details and arrangement of components may be made without departing from the spirit and scope of the invention as hereinafter claimed.

What is claimed is:

1. An EMI shielded structure for housing electronic parts or equipment comprising:

an enclosure comprising a substantially planar plate area having a first edge and at least one side wall extending substantially orthogonally to said plate area from said first edge;

said enclosure having a second edge forming an outer edge of said enclosure, said enclosure being made substantially of a molded resin;

an electromagnetic interference shield member comprising at least one of a thin, flexible wire netting or a metal foil having a plurality of small holes;

said electromagnetic interference shield member being disposed within said enclosure resin;

said electromagnetic interference shield member being slanted at said second edge of said at least one side wall of said enclosure;

said slanted portion of said electromagnetic interference shield beginning at an inner edge formed from the intersection of said side wall and said plate area of said enclosure; and said slanted portion of said electromagnetic interference shield member extending from and being exposed at said second edge of said side wall of said enclosure.

2. The structure as defined in claim 1, wherein said exposed shield member portion comprises an electrical contact.

3. The structure as defined in claim 1, wherein said enclosure comprises an air vent connecting the interior and exterior portions of said structure, said air vent having no resin material but comprising said electromagnetic interference shield member only.

4. The structure as defined in claim 1, wherein said side wall is substantially orthogonal to said plate area.

5. A method of manufacturing an enclosure for housing electronic parts or equipment, consisting of a box or a cover having a planar surface and sides with an exposed side edge and being molded by resin, using a fixed and a moveable die, comprising the steps of:

setting a pre-cut, planar plate-shaped electromagnetic interference shield member in a position to face said fixed die, said electromagnetic interference shield member being made of a thin, flexible wire netting or a metal foil having a plurality of small holes disposed on substantially all surfaces of said enclosure, and having an area large enough to leave an excess amount of member exposed from the edges of the enclosure after the molding of the enclosure;

shaping said electromagnetic interference shield member while closing said movable die in the direction of said fixed die;

injecting a molding resin material into a space formed by said fixed die and said movable die after the start of said die closing to cause part of said molding resin material to penetrate toward said movable die through the holes of said electromagnetic interference shield member;

moving said movable die to a final die closing position for pressing said electromagnetic interference shield member and resin material into the desired shape of said enclosure while leaving an excess amount of shield member at said exposed edge or said enclosure; and curing said shaped enclosure.

6. The method of manufacturing an EMI protected enclosure as defined in claim 5, further comprising forming an electrical contact from said excess member at said enclosure edge.

7. A method of manufacturing an EMI protected enclosure consisting of a box or a cover molded by resin for housing electronic parts or equipment, comprising the steps of:

setting a pre-cut, planar plate-shaped electromagnetic interference shield member in a position to face a fixed die, said electromagnetic interference shield member being made of a thin, flexible wire netting or a metal foil having a plurality of small holes, being disposed on substantially all surfaces of said enclosure, and having an area large enough to be exposed from the edges of the enclosure after the molding of the enclosure;

shaping and securing said electromagnetic interference shield member by closing said movable die in the direction of said fixed die;

injecting a molding resin material into a molding space formed by said fixed die and said movable die after said shaping and securing by the die closing, a portion of said material being injected through said secured shield member to completely fill said molding space; and curing said molded resin material.

8. The method of manufacturing an EMI protected enclosure as defined in claim 7, further comprising forming an electrical contact from said excess member at said enclosure edge.

9. A method of manufacturing an EMI protected enclosure consisting of a box or a cover molded by resin for housing electronic parts or equipment, an electromagnetic interference shield member existing inside the resin, wherein said electromagnetic interference shield member is made of a thin, flexible wire netting or a metal foil having a plurality of small holes, comprising:

setting said shield member between moveable and fixed parts of a mold die, in a pre-cut, planar plate-shaped state;

at least partially shaping said member by said movable die and a fixed die by closing said mold die; and injecting a curable plastic material into said mold die through and around said shield member.

10. A method of manufacturing an EMI protected enclosure for housing electronic parts or equipment, consisting of a box or a cover made of resin and containing within the resin an electromagnetic interference shield member and being molded by using a core die and a cavity die each of which has a respective outer periphery and which together define a mold volume having the shape of said enclosure, comprising the steps of:

setting a pre-cut, planar plate-shaped electromagnetic interference shield member in a position between said core die and said cavity die, said member having an area large enough to be exposed from the edges of the enclosure after the molding of the enclosure; and closing said core are and cavity die whereby said electromagnetic interference shield member extends out of a gap between the outer periphery of said cavity die and the outer periphery of said core die to the outside of said mold volume.

11. An enclosure consisting of a box or a cover molded by resin for housing electronic parts or equipment, an electromagnetic interference shield member being disposed inside the resin, wherein said electromagnetic interference shield member is exposed from the intersection points of the side wall outside of said enclosure and the edges of said enclosure.

12. The structure as defined in claim 11, wherein said exposed shield member portion comprises an electrical contact.

* * * * *